United States Patent [19]

Chen

[11] Patent Number: 5,006,200

[45] Date of Patent: Apr. 9, 1991

[54] METHOD OF BONDING COPPER AND RESIN

[75] Inventor: C. J. Chen, Taipei, Taiwan

[73] Assignee: Compeq Manufacturing Co., Ltd., Tao Yuan Hsien, Taiwan

[21] Appl. No.: 519,741

[22] Filed: May 7, 1990

[51] Int. Cl.$^5$ .......................... B44C 1/22; C23F 1/00; C03C 15/00; C03C 25/06

[52] U.S. Cl. ...................... 156/629; 156/630; 156/634; 156/637; 156/664; 156/902; 252/79.1; 252/79.5

[58] Field of Search ............... 156/629, 630, 634, 637, 156/656, 659.1, 664, 666, 901, 902; 252/79.1, 79.4, 79.5; 148/6.14 R, 6.2; 428/596, 601, 901

[56] References Cited

U.S. PATENT DOCUMENTS

| | | | |
|---|---|---|---|
| 2,291,592 | 7/1942 | Dowling | 156/666 X |
| 4,642,161 | 2/1987 | Akahoshi et al. | 156/630 |
| 4,702,793 | 10/1987 | Garlough et al. | 156/629 |
| 4,775,444 | 10/1988 | Cordani | 156/666 X |
| 4,902,551 | 2/1990 | Nakaso et al. | 156/902 X |

*Primary Examiner*—William A. Powell
*Attorney, Agent, or Firm*—Zarley, McKee, Thomte, Voorhees & Sease

[57] ABSTRACT

A method of bonding copper and resin comprising the steps of:

(a) forming a layer of copper oxide on the surface of copper by oxidation of copper;

(b) reducing the layer of copper oxide thus formed to cuprous oxide with a reducing solution of a controlled concentration and controlled pH at a controlled temperature under a circulated condition within a controlled period of time to modify its morphology; and (c) bonding the surface of the cuprous oxide formed by the reduction and a resin together by heat-pressing.

12 Claims, No Drawings

METHOD OF BONDING COPPER AND RESIN

BACKGROUND OF THE INVENTION

The present invention relates to a method of bonding copper and a resin together, and more particularly, to a method of bonding copper and a resin together with consistently high bonding strength and reduced formation of pink rings and laminate voids on a printed circuit board by treatment of the oxide layer formed between the copper and the resin.

Since no sufficient bonding strength between a metal and a resin can be secured by directly bonding the resin onto the smooth surface of the metal, a known method has heretofore been employed in which an oxide layer is formed on the surface of a metal to improve the bonding strength, as described in "Plating and Surface Finishing" vol. 69, No. 6. pg. 96–99 (June, 1982).

Nowadays, the formation of a layer of copper oxide on an inner surface of copper so as to enhance the bondage between copper and resin has become an inevitable step in the production of printed circuit boards or multilayer printed wiring boards. However, an inherent problem in the method is that copper oxide is readily eroded upon contact with an aqueous acidic solution by becoming copper ions dissolved therein. In addition, the brittle and poor mechanical properties of the oxide layer as well as the tendency of the oxide layer to get wet and contaminated easily, nevertheless, have caused "pink rings" and "laminate voids" on boards thus produced. The formation of pink rings and laminate voids represents serious defects in the boards especially in an era when increasingly high quality and reliability are demanded. These defects have become bottleneck in the production of multilayer printed wiring boards to pursue further and higher development.

To enhance the bondage between copper and resin, as is well-known, a layer of copper oxide was formed between the copper and resin in the production of printed circuit boards or multilayer printed wiring boards. The formation of the copper oxide is:
(a) to act as an interface between the copper and resin to prevent the direct contact of resin with copper which may cause premature aging of the resin; and
(b) to provide a surface of higher roughness so as to enhance the bondage between copper and resin.

However, oxide layer which is very fine in structure is subjected to contamination by dirt and humidity which cause the formation of "laminate voids". Furthermore, as the oxide layer is easily eroded to dissolve upon contact with an acid, the area where the oxide layer has been eroded reveals the color of the underlying copper which is pink in color and thus causes the formation of the so called "pink rings".

The area where the formation of "laminate voids" and/or "pink rings" occurs indicates that the resin is not in contact with the copper and thus the poor bondage therebetween. In other words, the greater the number of and the larger the size of the presence of "laminate voids" and/or "pink rings" on the printed circuit board, the lower the quality of the printed circuit board.

Unfortunately, nearly all printed circuit boards with more than four layers suffer from the formation of "laminate voids" and/or "pink rings". Therefore, the reduction in number and size of the "laminate voids" and "pink rings" has become one of the most popular and important topics in the field of the production of printed circuit boards.

Accordingly, a novel method of bonding copper and resin which mitigates and/or obviates the abovementioned drawbacks is provided.

SUMMARY OF THE INVENTION

It is therefore a primary object of the present invention to provide a method of bonding copper and a resin together which provides a good resistance to acids as well as a sufficiently high bonding strength, and particularly provides a method of bonding copper and a resin together in which the product is suitable for lamination in the production of multilayer printed wiring boards of reduced formation of pink rings and laminate voids.

In order to attain the above-mentioned object, the method of bonding copper and a resin together according to the present invention comprises the step of forming a copper oxide layer on the surface of copper by oxidation of copper, the step of reducing the formed copper oxide layer to cuprous oxide with a reducing solution of controlled concentration and controlled pH at a controlled temperature under a well-circulated condition within a controlled period of reaction time to modify the morphology thereof, and the step of bonding the surface of the above-mentioned cuprous oxide formed by the reduction and a resin together by, for example, heat-pressing thereof.

DETAILED DESCRIPTION OF THE PREFERRED EMBODIMENT

The method according to this invention comprises the step of forming a copper oxide layer on the surface of copper by oxidation of copper, the step of reducing the formed copper oxide layer to cuprous oxide with a reducing solution of controlled concentration and controlled pH at a controlled temperature under a well ciculated condition within a controlled period of reaction time to modify the morphology thereof, and the step of bonding the surface of the above-mentioned metallic copper formed by the reduction and a resin together by, for example, heat-pressing thereof.

The step of forming a copper oxide layer on the surface of copper by oxidation of copper is known in the art and thus details concerning this step require no further description.

The step of reducing the formed copper oxide layer to cuprous oxide should be carried out in a reducing solution of controlled concentration and controlled pH at a controlled temperature under a well ciculated condition within a controlled period of reaction time.

For the purpose of the present invention, the reducing solution contains at least one reducing agent selected from the group consisting of diamine ($N_2H_4$), formaldehyde (HCHO), sodium thiosulfate ($Na_2S_2O_3$) and sodium borane ($NaBH_4$) dissolved in water.

For the purpose of the present invention, the concentration of the reducing solution is maintained in the range between about 10 g/l and 100 g/l.

For the purpose of the present invention, the pH value of the reducing solution is maintained in the range between about 7 and 12. NaOH may be added if necessary.

For the purpose of the present invention, the temperature of the reducing solution should be kept constant in the range between about 20° C. and 35° C.

For the purpose of the present invention, the reducing solution is subjected to circulation in order to prevent the self-acceleration and localization of the reaction during the process of reduction.

For the purpose of the present invention, the reaction time of the copper oxide and the reducing solution should be carefully controlled such that all copper oxide is just reduced to cuprous oxide but not metallic copper. Usually, the reaction time is in the range between about 2 and 20 minutes depending on the completeness of the reduction.

During operation, the printed circuit board formed with copper oxide (either black oxide or brown oxide) is dipped vertically in the reducing solution containing one or more of the above-listed reducing agent at a concentration of about 10 g/l to 100 g/l with a pH of about 7 to 12 and a constant temperature of about 20° C. to 35° C. under a circulated condition for about 2 to 20 minutes depending on the degree of reduction. Preferably, a device for filtering the reducing solution under circulation is installed therein.

After the step of reduction, the treated board formed with cuprous oxide layer is washed with clean water, dried and then subjected to the step of bonding the surface of the cuprous oxide and the resin.

The step of bonding the surface of the above-mentioned cuprous oxide layer formed by the reduction and a resin together can be carried out by heat-pressing which is known in the art and requires no further description.

It is appreciated that the bonding between cuprous oxide layer and the resin is very much stronger than the bonding between copper oxide layer and the resin. This is due to the formation a network bonding shown below:

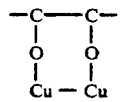

Due to the high bonding strength of the network bonding, the cuprous oxide layer is resistant to mechanical force and heat. Thus, the formation of laminate voids can be significantly reduced.

It has been noted that the hair-like morphology of the initial copper oxide layer is irregular. When the resin is pressed onto the copper oxide layer, the resin layer thus fails to completely cover each hair of the copper oxide layer. Therefore, the copper oxide layer is readily eroded upon contact with an aqueous acidic solution by becoming copper ions dissolved therein, and thereby causing the fomation of pink ring, i.e., the exposure of the underlying copper metal which is pink in color.

In the present invention, it has been discovered that the hair-like morphology of the cuprous oxide layer is regular. When the resin is pressed onto the cuprous oxide layer, the resin layer can completely cover each hair of the cuprous oxide layer. Thus, the fomation of pink ring can be significantly reduced.

It is observed that the printed circuit board produced by the method of this invention possesses the following improved qualities:

(1) The number of laminate voids on the board is reduced from the original 30–60% to less than 1%.
(2) The size of laminate voids is reduced from the original size 3–5 miles to less than 1 mil in radius.
(3) The size of pink rings is reduced from the original size 11–14 mils to 4–6 mils in radius.

While the present invention has been explained in relation to its preferred embodiment, it is to be understood that various modifications thereof will be apparent to those skilled in the art upon reading this specification. Therefore, it is to be understood that the invention disclosed herein is intended to cover all such modifications as fall within the scope of the appended claims.

I claim:

1. A method of bonding copper and resin comprising the steps of:
   (a) forming a layer of copper oxide on a surface of copper by oxidation of copper;
   (b) reducing said layer of copper oxide thus formed to cuprous oxide with a reducing solution of a controlled concentration and controlled pH at a controlled temperature under a well circulated condition within a controlled period of reaction time to modify the morphology thereof; and
   (c) bonding the surface of said cuprous oxide formed by the reduction and a resin together by heat-pressing.

2. A process as claimed in claim 1, wherein the reducing solution containing at least one reducing agent selected from the group consisting of diamine ($N_2H_4$), formaldehyde (HCHO), sodium thiosulfate ($Na_2S_2O_3$) and sodium borane ($NaBH_4$) dissolved in water.

3. A process as claimed in claim 1, wherein the concentration of the reducing solution is maintained in the range between about 10 g/l and 100 g/l.

4. A process as claimed in claim 1, wherein the pH value of the reducing solution is maintained in the range between about 7 and 12.

5. A process as claimed in claim 1, wherein the temperature of the reducing solution is kept constant in the range between about 20° C. and 35° C.

6. A process as claimed in claim 1, wherein the reducing solution is subjected to full circulation.

7. A process as claimed in claim 1, wherein the reaction time of the copper oxide and the reducing solution is controlled such that all copper oxide is just reduced to cuprous oxide but not metallic copper.

8. A process as claimed in claim 7, wherein the reaction time is in the range between about 2 and 20 minutes depending on the completeness of the reduction.

9. A process as claimed in claim 1, wherein said copper board formed with copper oxide is dipped vertically in said reducing solution.

10. A process as claimed in claim 1, wherein a device for filtering the reducing solution under circulation is installed therein.

11. A process as claimed in claim 1, wherein the treated copper board is washed with clean water and then dried after dipping.

12. A method of bonding copper and resin comprising the steps of:
   (a) forming a layer of copper oxide on a surface of copper by oxidation of copper;
   (b) reducing said layer of copper oxide thus formed to cuprous oxide with a reducing solution containing at least one reducing agent selected from the group consisting of diamine ($N_2H_4$), formaldehyde (HCHO), sodium thiosulfate ($Na_2S_2O_3$) and sodium borane ($NaBH_4$) dissolved in water at a concentration between about 10 g/l and 100 g/l with the addition of NaOH to maintain a pH value between 7 and 12 by vertically dipping the copper board formed with copper oxide in said reducing solution isothermally at about 20° to 35° C. under a circulated condition for about 2 to 20 minutes, wherein a device for filter circulation is installed within said reducing solution, said treated copper board being washed with clean water and dried after dipping; and (c) bonding the surface of said cupros oxide formed by the reduction and a resin together by heat-pressing.

* * * * *